(12) United States Patent
Xie

(10) Patent No.: US 7,265,028 B2
(45) Date of Patent: Sep. 4, 2007

(54) METHOD FOR PRODUCING DISLOCATION-FREE STRAINED CRYSTALLINE FILMS

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/672,609

(22) Filed: Feb. 8, 2007

(65) Prior Publication Data

US 2007/0128830 A1 Jun. 7, 2007

Related U.S. Application Data

(62) Division of application No. 11/168,171, filed on Jun. 27, 2005.

(51) Int. Cl.
*H01L 21/30* (2006.01)
(52) U.S. Cl. ............... 438/457; 257/E21.122
(58) Field of Classification Search ........... 438/455, 438/457, 458, 459; 257/E21.122
See application file for complete search history.

(56) References Cited

U.S. PATENT DOCUMENTS

| 5,371,037 | A | * | 12/1994 | Yonehara | .............. | 438/459 |
|---|---|---|---|---|---|---|
| 5,374,564 | A | | 12/1994 | Bruel | | |
| 5,523,254 | A | | 6/1996 | Satoh et al. | | |
| 5,801,084 | A | | 9/1998 | Beasom et al. | | |
| 5,966,620 | A | * | 10/1999 | Sakaguchi et al. | .......... | 438/455 |
| 5,989,981 | A | * | 11/1999 | Nakashima et al. | ........ | 438/459 |
| 5,993,677 | A | | 11/1999 | Biases et al. | | |
| 6,613,678 | B1 | * | 9/2003 | Sakaguchi et al. | .......... | 438/695 |
| 6,953,735 | B2 | | 10/2005 | Yamazaki et al. | | |
| 7,067,430 | B2 | * | 6/2006 | Maa et al. | ............... | 438/705 |
| 7,094,666 | B2 | * | 8/2006 | Henley et al. | ............ | 438/457 |
| 7,195,987 | B2 | * | 3/2007 | Bae et al. | .................. | 438/406 |
| 2002/0090758 | A1 | * | 7/2002 | Henley et al. | ............ | 438/110 |
| 2004/0248378 | A1 | * | 12/2004 | Ghyselen et al. | .......... | 438/458 |

OTHER PUBLICATIONS

Ghyselen, B., et al., "Engineering Strained Silicon on Insulator Wafers with the SMART CUT™ Technology", Solid-State Electronics 48, pp. 1285-1296 (2004).

* cited by examiner

*Primary Examiner*—Scott B. Geyer
(74) *Attorney, Agent, or Firm*—Vista IP Law Group LLP

(57) ABSTRACT

A method for forming dislocation-free strained silicon thin film includes the step of providing two curved silicon substrates. One substrate is curved by the presence of silicon dioxide on a back surface. The other substrate is curved by the presence of a silicon nitride layer. One of the substrates is subject to hydrogen implantation and the two substrates are bonded to one another in an annealing process. The two substrates are separated, thereby leaving a layer of strained silicon on a front side of one of the substrates. A back side layer of silicon dioxide or silicon nitride is then removed to restore the substrate to a substantially planar state. The method may be employed to form dislocation-free strained silicon thin films. The films may be under tensile or compressive strain.

9 Claims, 3 Drawing Sheets

METHOD FOR PRODUCING DISLOCATION-FREE STRAINED CRYSTALLINE FILMS

Reference To Related Applications

This Application is a divisional of and claims priority to U.S. patent application Ser. No. 11/168,171 filed on Jun. 27, 2005. Priority is claimed under 35 U.S.C. §§ 120 and 121. U.S. patent application Ser. No. 11/168,171 is incorporated by reference as if set forth fully herein.

FIELD OF THE INVENTION

The field of the invention generally relates to methods and processes used to form tensile-strained or compressively-strained crystalline (e.g., silicon) films. More particularly, the field of the invention relates to methods and processes that are used to form thin films.

BACKGROUND OF THE INVENTION

Strained silicon is increasingly being used to improve the performance of silicon-based CMOS transistors. For example, tensile-strained silicon is one of the most promising solutions to improve $I_{on}/I_{off}$ ratio and transconductance when traditional devices reach physical size limits. Strained silicon is also attractive for use in semiconductor-based devices because of strained silicon's ability to be readily integrated into CMOS processes, standard MOSFET architectures, and circuit layouts.

For example, strained silicon enables improvements in CMOS performance and functionality via replacement of the bulk, cubic-crystal silicon with a tetragonally distorted, biaxially strained silicon surface thin film. In addition, strained silicon film has electronic properties that are superior to those of bulk silicon. For instance, the strained silicon film has greater electron and hole mobilities, which translate into greater drive current capabilities for NMOS and PMOS transistors.

Strained silicon has generally been formed using a strained silicon heterostructure that involves several steps. First a SiGe relaxed graded layer is formed to engineer the lattice constant of the SiGe alloy. The relaxed SiGe graded layer is an epitaxially-grown thin film with a sequence of layers that have a gradually increasing Ge content up to a final Ge composition. Next, a constant composition Ge film is grown to spatially separate the subsequent strained silicon film from the misfit dislocations that are intentionally introduced in the SiGe relaxed graded layer. The final step is the deposition of the silicon film, which is placed in a state of biaxial tension as it conforms to the lattice of the constant-composition SiGe layer.

Strained silicon has also been used in conjunction with silicon-on-insulator (SOI) devices. For example, B. Ghyselen et al. disclose a process of engineering strained silicon on insulator wafers using SMART CUT process. See B. Ghyselen et al., *Engineering Strained Silicon on Insulator Wafers with the SMART CUT Technology*, Solid-State Electronics 48, pp. 1285-1296 (2004). The contents of the above-identified publication is incorporated by reference as if set forth fully herein.

According to one process, tensile-strained silicon is formed on insulator wafers by starting with an epitaxial layer stack ending with relaxed SiGe on top of an intermediate graded buffer layer. Hydrogen implantation is then performed on the relaxed SiGe layer, and the SMART CUT process is used to peel off the very top part of the epitaxial stack and is transferred to another silicon substrate. A strained silicon layer is then grown on top of the relaxed SiGe layer (SGOI).

In another method, tensile-strained silicon is grown directly on the relaxed SiGe layer of the donor wafer. A bi-layer containing the strained silicon and the relaxed SiGe layer is then transferred to another substrate using the SMART CUT process. After removal of the SiGe layer, the tensile-strained silicon layer is exposed, forming strained silicon on insulator (sSOI).

While methods are know for growing strained silicon layers, there is a need for a method or process for creating strained silicon that is substantially or completely free of dislocations. Conventional methods of forming strained silicon such as use of a compositionally graded SiGe buffer layer or oxidation of SiGe produces threading dislocations in the resulting strained silicon layer. Even in the methods disclosed in the B. Ghyselen et al., dislocations in the SiGe layer are transferred or otherwise communicated to the adjacent strained silicon layer. Dislocations that are formed in strained silicon (particularly threading dislocations), however, impair the overall performance of the device.

SUMMARY OF THE INVENTION

In one aspect of the invention, a method for forming dislocation-free strained silicon thin film includes the step of providing two curved silicon substrates. One substrate is curved by the presence of silicon dioxide on a back surface. The other substrate is curved by the presence of a silicon nitride layer. One of the substrates is subject to hydrogen implantation and the two substrates are bonded to one another in an annealing process. The two substrates are separated, thereby leaving a layer of strained silicon on the front side of one of the substrates. A back side layer of silicon dioxide or silicon nitride is then removed to restore the substrate to a substantially planar state. The method may be employed to form dislocation-free strained silicon thin films. The films may be under tensile or compressive strain.

In one aspect of the invention, a silicon dioxide layer is formed on the back side of the first substrate that causes the first substrate to transform into a curved shape. A silicon nitride layer is provided on the back side of the second substrate and causes the second substrate to transform into a curved shape. The front side of the second substrate is then subject to hydrogen ion implantation. The front sides of the first and second substrates are then bonded to each other in an annealing process. The second substrate is separated from the first substrate such that a layer of strained silicon remains on the front side of the first substrate. The silicon dioxide layer on the back side of the first substrate is removed to return the first substrate to a substantially planar state. A dislocation-free tensile-strained silicon thin film is thus formed.

In one aspect of the process described above, the silicon dioxide layer on the back side of the first substrate is patterned. In another aspect of the process, the second substrate has a smaller thickness than the first substrate. The degree of curvature of the second substrate may be greater than the degree of curvature of the first substrate.

In one aspect of the process described above, the second substrate may be reused by removing the silicon nitride layer and subjecting the back side of the second substrate to a chemical mechanical polishing (CMP) process.

In an alternative aspect of the invention the front side of the second substrate includes a SiGe etch stop layer and an epitaxially grown silicon layer on top of the SiGe etch layer.

In an alternative aspect of the invention, a silicon nitride layer is formed on the back side of the first substrate that causes the first substrate to transform into a curved shape. A silicon dioxide layer is provided on the back side of the second substrate and causes the second substrate to transform into a curved shape. The front side of the second substrate is then subject to hydrogen ion implantation. The front sides of the first and second substrates are then bonded to each other in an annealing process. The second substrate is separated from the first substrate such that a layer of strained silicon remains on the front side of the first substrate. The silicon nitride layer on the back side of the first substrate is removed to return the first substrate to a substantially planar state. A dislocation-free compressive-strained silicon thin film is thus formed.

Although silicon thin films are described herein, the methods and processes discussed can be equally applicable to other crystalline films such as GaAs, InAs, GaN, and other III-V and II-VI compound semiconductor materials.

Further features and advantages will become apparent upon review of the following drawings and description of the preferred embodiments.

DETAILED DESCRIPTION OF THE PREFERRED EMBODIMENTS

Figure 1:
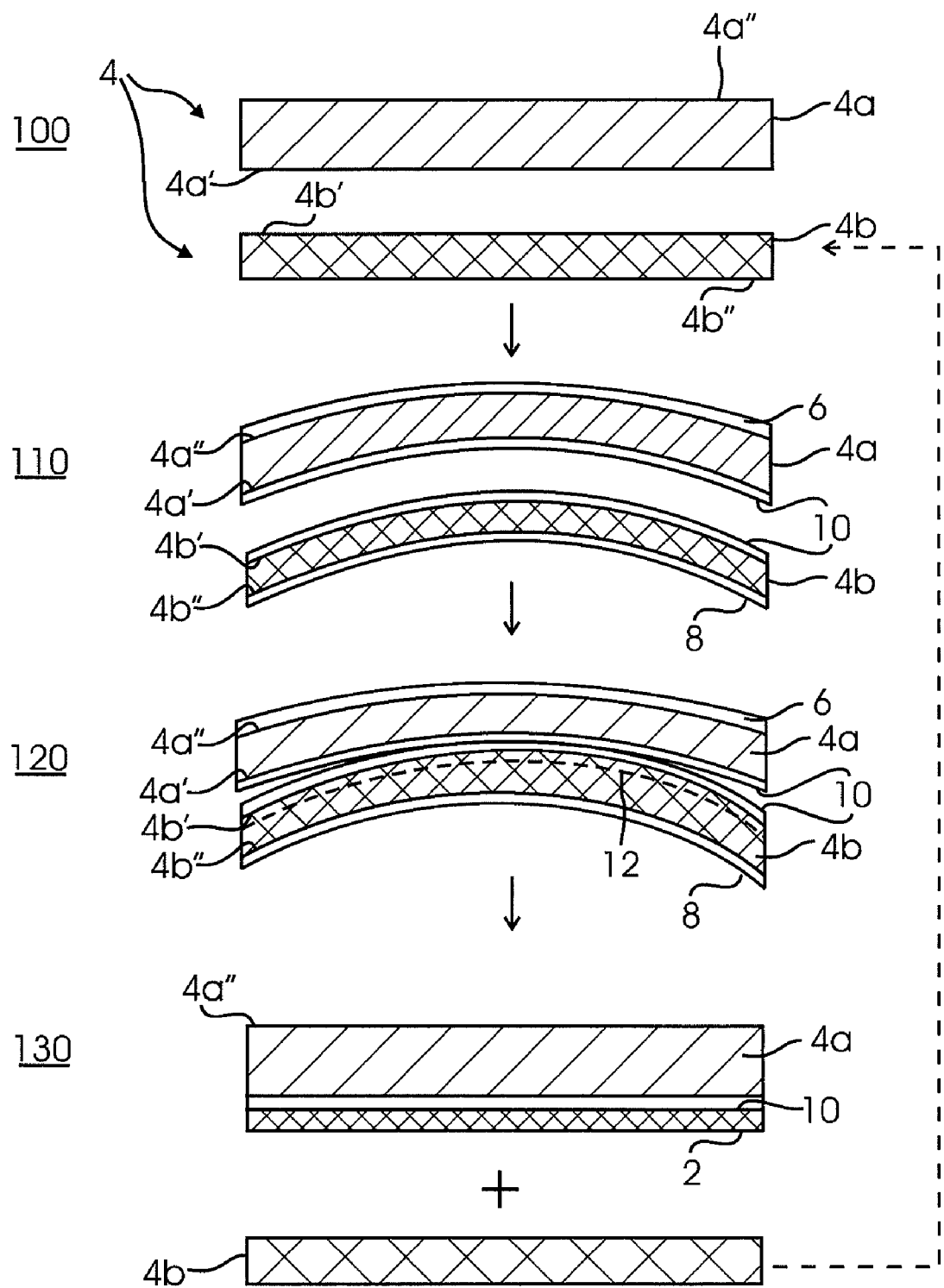
FIG. 1 illustrates a method of forming dislocation-free tensile-strained silicon thin films according to one aspect of the invention.
Figure 2:
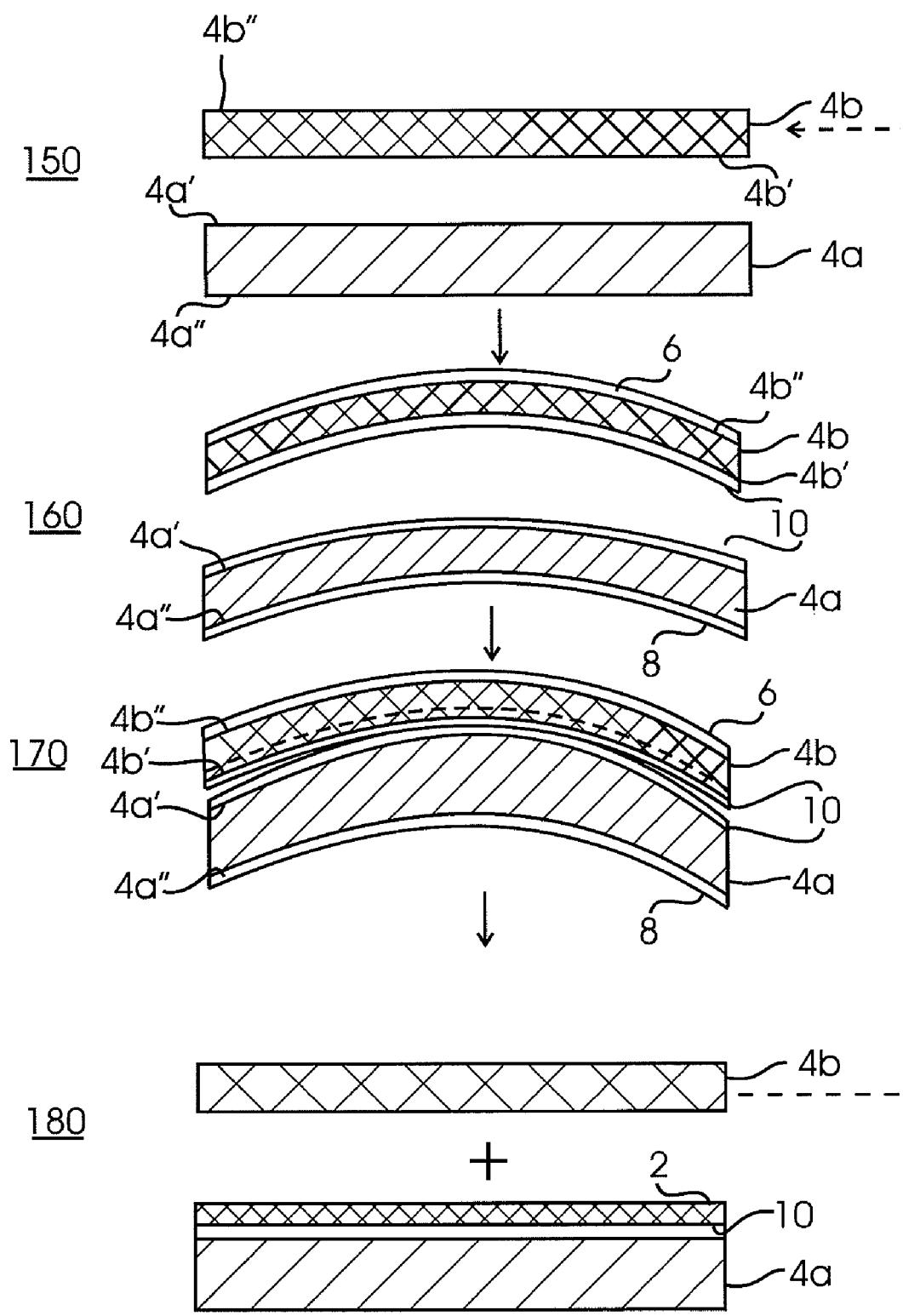
FIG. 2 illustrates a method of forming dislocation-free compressively-strained silicon thin films according to another aspect of the invention.

FIGS. 1 and 2 illustrate two methods for forming a dislocation-free strained silicon thin film 2 on a substrate 4. FIG. 1 illustrates a process for making a tensile-strained silicon thin film 2 while FIG. 2 illustrates a process for making compressively-strained silicon thin film 2. A key advantage of the process described herein is that there are substantially no dislocations formed in the thin film 2. Consequently, the strained film 2 is completely free of dislocations (e.g., threading dislocations) and is very homogeneous. The improved properties of the resultant strained thin film 2 make it particularly useful for incorporation into semiconductor-based devices.

With reference now to FIG. 1, the process begins (step 100 in FIG. 1) by providing a first substrate 4a and a second substrate 4b. The first and second substrates 4a, 4b may comprise, for example, a silicon substrate in the form of a wafer or the like. Of course other materials other than silicon may be used in accordance with the methods described herein. In one aspect of the invention, the second substrate 4b may have a thickness that is less than the thickness of the first substrate 4a. The reduced thickness of the second substrate 4b makes the second substrate 4b more pliable and may facilitate the bonding of the first and second substrates 4a, 4b as is described in detail below. In addition, the different thicknesses may mitigate the possibility of trapped gas bubbles between the two substrates 4a, 4b during the bonding process.

Both the first and second substrates 4a, 4b include a front surface 4a', 4b' and a back surface 4a", 4b". The front surface 4a', 4b' may include, for example, the polished surface of a silicon (001) wafer while the back surface 4a", 4b" may include, an unpolished surface. As seen in step 100 of FIG. 1, the front surface 4a' of the first substrate 4a is shown opposite the front surface 4b' of the second substrate 4b.

As seen in step 110 in FIG. 1, a film 6 such as a dielectric is grown or otherwise deposited on the back side 4a" of the first substrate 4a. In one aspect of the process, the back side 4a" is subject to an oxidation process to form a film 6 or layer of silicon dioxide (e.g., a silicon dioxide containing layer). The silicon dioxide film 6 is formed via thermal oxidation and is therefore under compressive stress. Consequently, the first substrate 4a forms the curved or arcuate shape as illustrated in step 110 of FIG. 1. Of course, other films 6 that are under compressive stress may be used in accordance with the process described herein.

An optional thin film of silicon nitride (not shown) on the front side 4a' of the first substrate 4a may be used to prevent oxidation. In addition, an optional pattern may be formed in the film 6 disposed on the back side 4a" of the first substrate 4a. The pattern may be used to modify or "fine tune" the curvature of the first substrate 4a at various positions.

A high-stress silicon nitride layer 8 (e.g., a silicon nitride containing layer) is then deposited on the back side 4b" of the second substrate 4b. Preferably, the silicon nitride is deposited on the second substrate 4b by chemical vapor deposition (CVD) under a high degree of tensile stress. Consequently, the second substrate 4b forms the curved or arcuate shape as illustrated in step 110 of FIG. 1. Of course, other materials that are under tensile stress may be used in place of silicon nitride.

In addition, as shown in step 110, the front side 4a' of the first substrate 4a and the front side 4b' of the second substrate 4b may contain an optional bonding layer 10 of silicon dioxide for hydrophilic bonding of the first and second substrates 4a, 4b. The optional bonding layer 10 may be omitted if a hydrophobic silicon-on-silicon structure is desired.

Now referring to step 120 in FIG. 1, the front side 4b' of the second substrate 4b is then subject to hydrogen ion implantation to facilitate subsequent silicon film exfoliation (described below). The depth of penetration of the hydrogen ions in the front side 4b' of the second substrate 4b is illustrated by the dashed line 12. Hydrogen ion implantation techniques are well known to those skilled in the art. For example, hydrogen ion implantation techniques used in connection with the so-called SMART-CUT process described in U.S. Pat. Nos. 5,374,564 and 5,993,677 and in B. Ghyselen et al., *Engineering Strained Silicon on Insulator Wafers with the SMART CUT Technology*, Solid-State Electronics 48, pp. 1285-1296 (2004) may be employed. The contents of the above-identified patents are incorporated by reference as if set fully herein.

Still referring to step 120 in FIG. 1, the front sides 4a', 4b' of the first and second substrates 4a, 4b are cleaned using, for example, wet chemical cleaning followed by an optional surface activation step in plasma. The front sides 4a', 4b' of the first and second substrates 4a, 4b are then bonded to one another in a face-to-face arrangement. Preferably, the bonding process is initiated in a central region of the substrates 4a, 4b, as is shown in step 120.

The substrates 4a, 4b are then subject to a low temperature anneal to establish the initial bonding. After initial bonding, the substrates 4a, 4b are subject to a medium temperature annealing process used in the well known SMART-CUT process to thereby separate substrate 4a from substrate 4b. The SMART-CUT process leaves a portion or layer of silicon from the second substrate 4b on the first substrate 4a. The layer of silicon is transferred to the first substrate 4a because of the weakened zone created in the second substrate 4b by the hydrogen ion implantation.

After the two substrates 4a, 4b are separated, the film 6 (e.g. silicon dioxide film) from the back side 4a" of the first substrate 4a is then removed. After removal of the silicon dioxide film layer 6, the substrate 4a returns to a substantially planar state (as is shown in step 130 in FIG. 1). The now planar substrate 4a contains a thin layer 2 of strained silicon under tensile stress. The degree of tensile stress in the thin layer 2 is largely determined by the degree of curvature of the substrate 4a formed in step 110. In addition, the separation process liberates a second substrate 4b that can be used in a subsequent wafer-bonding process as is shown by the dashed arrow in FIG. 1.

The first substrate 4a having the strained silicon layer 2 may undergo an additional high temperature anneal process to perfect bonding. In addition, the first substrate 4a may then undergo a CMP process to flatten the exfoliated surface of the strained silicon thin layer 2. Optionally, a step for the controlled thinning of the strained silicon film 2 may follow. This last optional step may be advantageous for applications such as fully depleted strained silicon on insulator (sSOI) structures.

FIG. 2 illustrates a process for making compressively-strained silicon thin film 2. As seen in FIG. 2, in step 150, first and second substrates 4a, 4b are provided. The first and second substrates 4a, 4b may comprise, for example, a silicon substrate 4 in the form of a wafer or the like. In one aspect of the invention, the second substrate 4b may have a thickness that is less than the thickness of the first substrate 4a.

Both the first and second substrates 4a, 4b include a front surface 4a', 4b' and a back surface 4a", 4b". As seen in step 150 of FIG. 2, the front surface 4a' of the first substrate 4a is shown opposite the front surface 4b' of the second substrate 4b.

In step 160 in FIG. 2, a film 6 such as a dielectric is grown or otherwise deposited on the back side 4b" of the second substrate 4b. In one aspect of the process, the back side 4b" is subject to an oxidation process to form a film 6 or layer of silicon dioxide. The silicon dioxide film 6 is formed via thermal oxidation and is therefore under compressive stress. Consequently, the second substrate 4b forms the curved or arcuate shape as illustrated in step 160 of FIG. 2. Of course, other films 6 that are under compressive stress may be used in accordance with the process described herein.

An optional thin film of silicon nitride (not shown) on the front side 4b' of the second substrate 4b may be used to prevent oxidation. In addition, an optional pattern may be formed in the film 6 disposed on the back side 4b" of the second substrate 4b. As disclosed above, this pattern may be used to alter or modify the curvature of the second substrate 4b at various points or locations across its surface.

With reference to step 160 in FIG. 2, a high-stress silicon nitride layer 8 is then deposited on the back side 4a" of the first substrate 4a. Preferably, the silicon nitride layer is deposited on the first substrate 4a by chemical vapor deposition (CVD) under a high degree of tensile stress. Consequently, the first substrate 4a forms the curved or arcuate shape as illustrated in step 160 of FIG. 2. Of course, other materials that are under tensile stress may be used in stead of silicon nitride.

Optionally, as is shown in step 160 of FIG. 2, the front side 4a' of the first substrate 4a and the front side 4b' of the second substrate 4b may contain an optional bonding layer 10 of silicon dioxide for hydrophilic bonding of the first and second substrates 4a, 4b. It should be understood, however, that the optional bonding layer 10 may be omitted if a hydrophobic silicon-on-silicon structure is desired.

Next, with reference to step 170 in FIG. 2, the front side 4b' of the second substrate 4b is then subject to hydrogen ion implantation to facilitate subsequent silicon film separation. The techniques described above with respect to the process illustrated in FIG. 1 are used for hydrogen ion implantation. The depth of penetration of the hydrogen ions in the front side 4b' of the second substrate 4b is illustrated by the dashed line 12.

The front sides 4a', 4b' of the first and second substrates 4a, 4b are cleaned using, for example, wet chemical cleaning followed by an optional surface activation step in plasma. The front sides 4a', 4b' of the first and second substrates 4a, 4b are then bonded to one another in a face-to-face arrangement. Preferably, the bonding process is initiated in a central region of the substrates 4a, 4b, as is shown in step 170.

The substrates 4a, 4b are then subject to a low temperature anneal to establish the initial bonding. After initial bonding, the substrates 4a, 4b are subject to a medium temperature annealing process used in the well known SMART-CUT process to thereby separate substrate 4a from substrate 4b. The SMART-CUT process leaves a portion or layer of silicon from the second substrate 4b on the first substrate 4a. The layer of silicon is transferred to the first substrate 4a because of the weakened zone created in the second substrate 4b by the hydrogen ion implantation.

After the two substrates 4a, 4b are separated, the high-stress silicon nitride layer 8 located on the back side 4a" of the first substrate 4a is then removed. After removal of the silicon nitride layer 8, the substrate 4a returns to a substantially planar state (as is shown in step 180 in FIG. 2). The now planar substrate 4a contains a thin layer 2 of strained silicon under compressive stress. The degree of compressive stress in the thin layer 2 is largely determined by the degree of curvature of the substrate 4a formed in step 160. In addition, the separation process liberates a second substrate 4b that can be used in a subsequent wafer-bonding process as is shown by the dashed arrow in FIG. 2.

The first substrate 4a having the strained silicon layer 2 may undergo an additional high temperature anneal process to perfect bonding. Also, the first substrate 4a may then undergo a CMP process to flatten the exfoliated surface of the strained silicon thin layer 2. Optionally, a step for the controlled thinning of the strained silicon film 2 may follow. This last optional step may be advantageous for applications such as fully depleted strained silicon on insulator (sSOI) structures.

Figure 3:
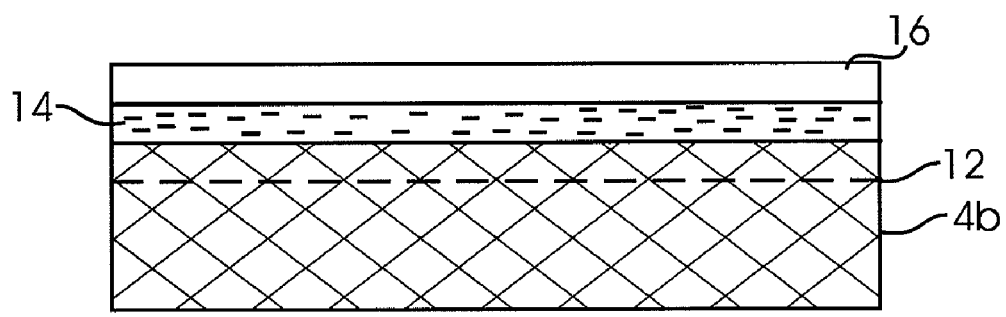
FIG. 3 illustrates a cross-sectional view of a silicon substrate having an epitaxially-grown SiGe etch stop layer and a thin epitaxially-grown silicon film.

FIG. 3 illustrates a cross-sectional view of a silicon substrate having an epitaxially-grown SiGe etch stop layer 14 and a thin epitaxially-grown silicon film 16 on top of the SiGe etch stop layer 14. The SiGe etch stop layer 14 is formed on top of the second substrate 4b illustrated in FIGS. 1 and 2. Also illustrated in FIG. 3 is the hydrogen implantation layer 12 (represented by dashed line) used for the subsequent SMART-CUT process. The layered structure illustrated in FIG. 3 may be particularly advantageous for obtaining ultra-thin strained silicon films with flat surfaces for fully-depleted MOSFET applications. In this alternative aspect of the invention, the SiGe layer 14 may be formed on the second substrate 4*b* before all other process steps. The SiGe layer 14 is preferably fully commensurate with the silicon (001) substrate 4*b*. The SiGe layer 14 allows for the planarization of a very thin silicon film 2 that can be grown on top of it using conventional wet chemical etchant(s) that have a higher etch rate for silicon than for SiGe.

Figure 4A:
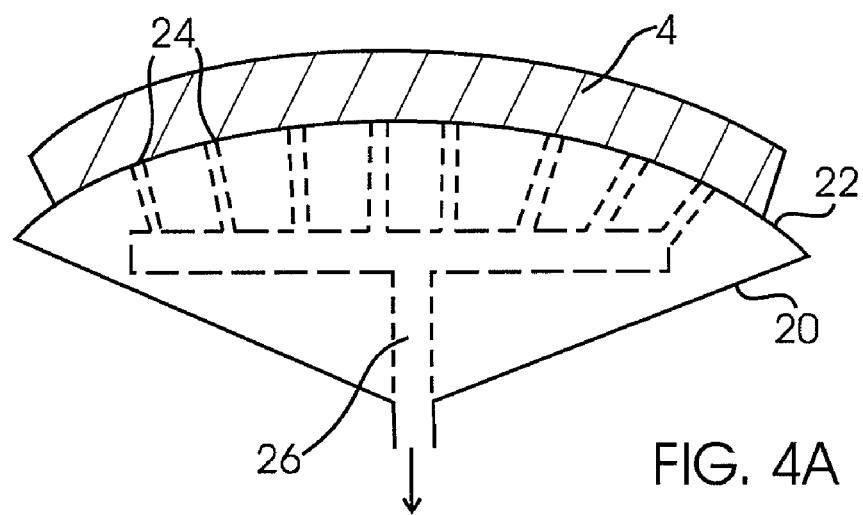
FIG. 4A illustrates a convex vacuum chuck device used to forcibly curve or bend a substrate into a convex shape.
Figure 4B:
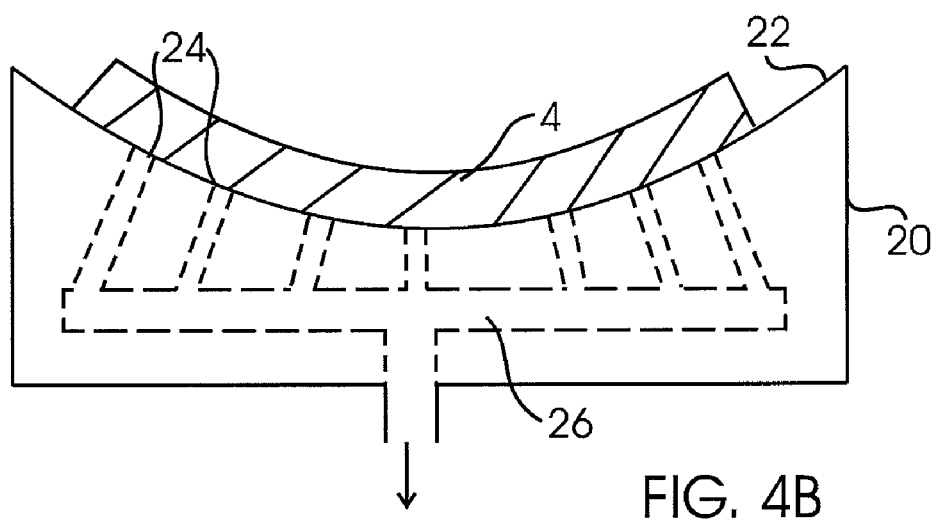
FIG. 4B illustrates a concave vacuum chuck device used to forcibly curve or bend a substrate into a concave shape.

FIGS. 4A and 4B illustrate two embodiments of a vacuum chuck 20 used in an alternative aspect of the process. The vacuum chucks 20 include a contact surface 22 for holding a substrate 4. The contact surface 22 includes a plurality of holes or openings 24 that are in fluid communication with a passageway or plenum 26 therein that is coupled to a source of vacuum 28. The holes or openings 24 in the vacuum chucks 20 create a vacuum environment adjacent to the contact surface 22 of the vacuum chucks 20. The vacuum environment forcibly "pulls" the substrate 4 adjacent to the contact surface 22 of the vacuum chuck 20. FIG. 4A illustrates a vacuum chuck 20 for bending a substrate 4 into a convex curvature. FIG. 4B illustrates a vacuum chuck 20 for bending a substrate 4 into a concave structure.

The vacuum chucks 20 illustrated in FIGS. 4A and 4B may be used in stead of the films 6, 8 used to induce tensile/compressive stress (and thereby cause curvature) in the substrates 4.

While embodiments of the present invention have been shown and described, various modifications may be made without departing from the scope of the present invention. Moreover, it should be understood that variation in the specific order of the steps described herein are contemplated to be within the scope of the invention. For instance, the silicon dioxide containing layer may be formed on the first substrate prior to or after the formation of the silicon nitride containing layer on the second substrate. The invention, therefore, should not be limited, except to the following claims, and their equivalents.

What is claimed is:

1. A method of forming thin films comprising:
   providing a first substrate having a first side and a second side;
   forming a silicon nitride containing layer on the second side of the first substrate, the silicon nitride containing layer causing the first substrate to transform into a curved shape;
   providing a second substrate having a first side and a second side;
   forming a silicon dioxide containing layer on the second side of the second substrate, the silicon dioxide containing layer causing the second substrate to transform into a curved shape;
   subjecting the first side of the second substrate to hydrogen ion implantation;
   bonding the first side of the first substrate to the first side of the second substrate in an annealing process; and
   separating the second substrate from the first substrate, wherein a layer of strained silicon remains on the first side of the first substrate.

2. The method of claim 1, further comprising the step of removing the silicon nitride containing layer on the second side of the first substrate, wherein removal of the silicon nitride containing layer returns the first substrate to a substantially planar state.

3. The method of claim 1, wherein the silicon nitride containing layer on the second side of the first substrate is patterned.

4. The method of claim 1, wherein the second substrate has a smaller thickness than the first substrate.

5. The method of claim 1, wherein the degree of curvature of the first substrate is greater than the degree of curvature of the second substrate.

6. The method of claim 1, wherein prior to bonding, the first side of the first substrate and the first side of the second substrate include a silicon dioxide containing layer.

7. The method of claim 1, further comprising the step of subjecting the first substrate to a second anneal process.

8. The method of claim 7, further comprising the step of subjecting the exposed layer of strained silicon to a chemical mechanical polishing process.

9. The method of claim 1, further comprising the steps of removing the silicon dioxide containing layer on the second side of the second substrate.

* * * * *